United States Patent
Chan et al.

(10) Patent No.: US 10,754,111 B1
(45) Date of Patent: Aug. 25, 2020

(54) METHOD FOR MODIFYING SMALL FORM FACTOR PLUGGABLE TRANSCEIVER FOR AVIONICS APPLICATIONS

(71) Applicant: The Boeing Company, Chicago, IL (US)

(72) Inventors: Eric Yuen-Jun Chan, Mercer Island, WA (US); Dennis G. Koshinz, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/391,136

(22) Filed: Apr. 22, 2019

(51) Int. Cl.
  *G02B 6/42* (2006.01)
  *H04B 10/25* (2013.01)
  *G02B 6/28* (2006.01)

(52) U.S. Cl.
  CPC ......... *G02B 6/4261* (2013.01); *G02B 6/2821* (2013.01); *G02B 6/4278* (2013.01); *H04B 10/2589* (2020.05)

(58) Field of Classification Search
  CPC .................................. G02B 6/42; H04B 10/25
  USPC .......................................................... 385/92
  See application file for complete search history.

(56) References Cited

U.S. PATENT DOCUMENTS

| | | | | |
|---|---|---|---|---|
| 5,317,440 A * | 5/1994 | Hsu | ........................ | H04J 14/02 398/41 |
| 5,742,480 A * | 4/1998 | Sawada | ................ | G02B 6/4274 361/749 |
| 6,416,238 B1 * | 7/2002 | Gilliland | ............... | G02B 6/4249 385/88 |
| 7,359,592 B2 * | 4/2008 | Truong | .............. | H04B 10/2581 385/24 |
| 7,406,230 B2 * | 7/2008 | Yoshikawa | .......... | G02B 6/4201 385/14 |
| 7,416,353 B2 * | 8/2008 | Yoshikawa | .......... | G02B 6/4201 385/14 |
| 7,965,913 B2 * | 6/2011 | Chan | .................... | G02B 6/2817 385/46 |
| 8,554,032 B2 * | 10/2013 | Koshinz | ............... | G02B 6/3672 385/46 |
| 9,297,970 B1 * | 3/2016 | Chan | .................... | G02B 6/4253 |
| 9,438,338 B1 * | 9/2016 | Chan | ....................... | H04B 10/11 |

(Continued)

OTHER PUBLICATIONS

"Single-Wavelength Bi-Directional (SWBiDi) Transmission Technology", Publication of OE-Solutions, Inc.

*Primary Examiner* — Kaveh C Kianni
(74) *Attorney, Agent, or Firm* — Ostrager Chong Flaherty & Broitman P.C.

(57) ABSTRACT

A method for modifying a low-cost small form factor pluggable optical-electrical bidirectional transceiver (hereinafter "SFP transceiver") by converting the SFP transceiver into a dual-in-line package. Such conversion enables the SFP transceiver to be soldered directly on a printed circuit board of a line replaceable unit of an avionics system, thereby eliminating the concern that the SFP transceiver may become detached due to vibration during aircraft operation. The method also includes a sealing process to protect the contact pads on the SFP transceiver, thereby eliminating any concern that the contact pads could corrode due to long-term moisture and humidity exposure. The product of the method is a ruggedized SFP transceiver capable of withstanding the rigors of operating in a harsh avionics environment onboard an aircraft.

20 Claims, 15 Drawing Sheets

(56) References Cited

U.S. PATENT DOCUMENTS

| | | | | |
|---|---|---|---|---|
| 9,778,419 B1* | 10/2017 | Chan | | H04B 10/2507 |
| 2001/0030789 A1* | 10/2001 | Jiang | | G02B 6/4201 |
| | | | | 398/164 |
| 2003/0002823 A1* | 1/2003 | Wu | | G02B 6/4246 |
| | | | | 385/92 |
| 2003/0063424 A1* | 4/2003 | Inujima | | G02B 6/4246 |
| | | | | 361/115 |
| 2003/0152331 A1* | 8/2003 | Dair | | G02B 6/4246 |
| | | | | 385/59 |
| 2003/0206703 A1* | 11/2003 | Chiu | | G02B 6/4208 |
| | | | | 385/93 |
| 2004/0037517 A1* | 2/2004 | Dair | | G02B 6/4246 |
| | | | | 385/92 |
| 2004/0069997 A1* | 4/2004 | Dair | | G02B 6/4214 |
| | | | | 257/81 |
| 2004/0240803 A1* | 12/2004 | Rechberger | | G02B 6/4201 |
| | | | | 385/93 |
| 2005/0141819 A1* | 6/2005 | Ice | | G02B 6/4201 |
| | | | | 385/88 |
| 2005/0180754 A1* | 8/2005 | Mizue | | G02B 6/4246 |
| | | | | 398/135 |
| 2005/0196111 A1* | 9/2005 | Burdick | | G01M 11/00 |
| | | | | 385/92 |
| 2005/0244109 A1* | 11/2005 | Yabe | | G02B 6/4292 |
| | | | | 385/92 |
| 2005/0286838 A1* | 12/2005 | Oki | | G02B 6/4201 |
| | | | | 385/92 |
| 2005/0286839 A1* | 12/2005 | Yoshikawa | | G02B 6/4201 |
| | | | | 385/92 |
| 2006/0152406 A1* | 7/2006 | Leblanc | | G01S 7/032 |
| | | | | 342/175 |
| 2006/0215970 A1* | 9/2006 | Mizue | | G02B 6/3878 |
| | | | | 385/92 |
| 2006/0251361 A1* | 11/2006 | Ice | | G02B 6/4201 |
| | | | | 385/92 |
| 2008/0056647 A1* | 3/2008 | Margolin | | G02B 6/4201 |
| | | | | 385/89 |
| 2009/0010600 A1* | 1/2009 | Kim | | G02B 6/4246 |
| | | | | 385/90 |
| 2012/0195601 A1* | 8/2012 | Gambini | | H04B 10/504 |
| | | | | 398/200 |
| 2014/0049292 A1* | 2/2014 | Popescu | | G02B 6/43 |
| | | | | 327/100 |
| 2015/0037046 A1* | 2/2015 | Chan | | G02B 6/2808 |
| | | | | 398/175 |
| 2016/0085027 A1* | 3/2016 | Chan | | G02B 6/264 |
| | | | | 385/24 |

* cited by examiner

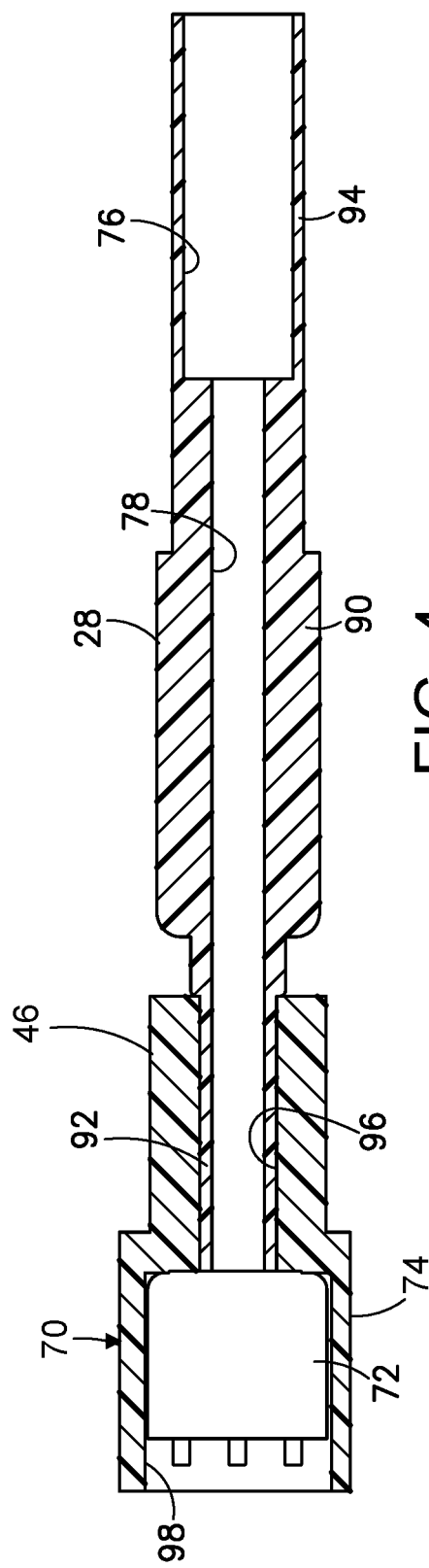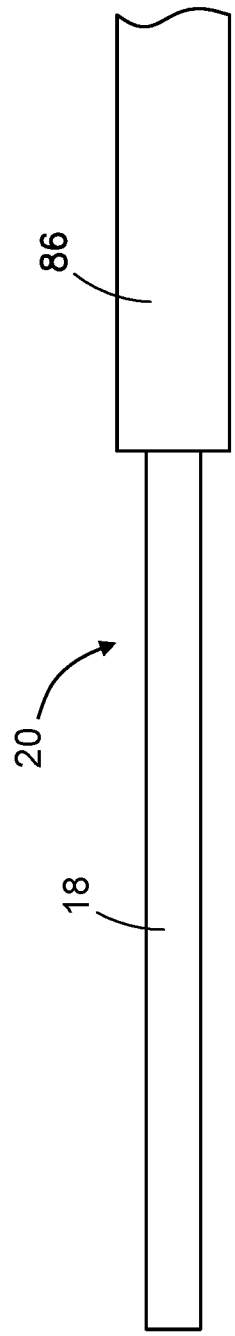
FIG. 4
FIG. 5

METHOD FOR MODIFYING SMALL FORM FACTOR PLUGGABLE TRANSCEIVER FOR AVIONICS APPLICATIONS

BACKGROUND

The technology disclosed herein generally relates to optical fiber networks that enable communication between electrical components. In particular, the technology disclosed herein relates to electrical avionics systems interconnected by an optical avionics data bus.

The use of optical fiber cables instead of electrical wiring for a high-speed avionics data network may result in significant reduction of weight, cost, electromagnetic effects, and complexity of electrical wiring integration. In modern aircraft, line replaceable units (LRUs) (such as avionics computers and sensor units) typically include a housing containing a transceiver to enable optical fiber communication with other LRUs. An optical connector on the LRU housing enables an external optical fiber cable to be connected to the LRU.

More specifically, each LRU connected to an optical avionics data bus typically includes an optical-electrical media converter) having an electro-optical transmitter and an opto-electrical receiver (hereinafter collectively referred to as an "optical-electrical bidirectional transceiver") to enable optical fiber communication with other LRUs. The electro-optical transmitter converts electrical signals into optical signals; the opto-electrical receiver converts optical signals into electrical signals. An optical connector on a housing of the LRU enables an optical fiber cable to be connected to the LRU.

In legacy avionics fiber optic systems, non-pluggable small form factor optical-electrical bidirectional transceivers (hereinafter "SFF transceivers") are used inside the LRU of the legacy avionics systems. But the current trend in the optical fiber industry is to gradually discontinue use of non-pluggable SFF transceivers and replace them with small form factor pluggable optical-electrical bidirectional transceivers (hereinafter "SFP transceivers"). As used herein, the term "pluggable", when used as an adjective to characterize a capability of a first component, means that the component may be coupled to and later uncoupled from a second component by inserting male portions (e.g., pins or plugs) of one of the first and second components into respective female portions (e.g., receptacles or sockets) of the other of the first and second components.

Many modern fiber optic communication system upgrades, new technology and new design features are no longer implemented using SFF transceivers in the industry. Commercially available SFP transceivers have advanced features built-in for modern fiber optic communication systems, including digital diagnostic monitoring and built-in testing. Also because the SFP transceiver is a widely accepted package format in the fiber optic industry, the cost of the SFP transceiver is very low due to the economy of scale. This industrial trend in the development of transceivers creates a problem when deploying new optical fiber systems in avionics platforms. For example, SFP transceivers need to be deployed in many LRUs of these new avionics optical fiber systems.

Some legacy avionic optical fiber systems use SFF transceivers which have a 10-pin (2×5) dual-in-line package format that allows the SFF package to be soldered permanently on the LRU printed circuit board (PCB) without concern for detachment due to vibration. But the currently popular SFP transceiver package has no solder pins and is designed to be pluggable into a 20-pin socket mounted on a PCB. Therefore, the transceiver is not permanently attached to the PCB. While this SFP design is acceptable for use in non-avionics environment, this design is not acceptable for avionics platforms due to concern over detachment of the SFP transceiver under vibration and also corrosion of the SFP transceiver's contact pads due to exposure to moisture and humidity.

One possible response to the above-described challenge is to fabricate customized SFP transceivers for different avionics platforms using hermetic transceiver packages. This course of action would be expensive. Also finding suppliers capable of making hermetic SFP packages may be challenging because hermetic package format is not part of the multi-source agreement for SFP transceivers in the fiber optic industry. One prior solution for partially ruggedizing an SFP transceiver involved simply depositing a conformal coating on the PCB of the SFP transceiver, but did not include soldering the SFP transceiver to the PCB of an LRU.

SUMMARY

The subject matter disclosed in some detail below includes a method for modifying a low-cost small form factor pluggable optical-electrical bidirectional transceiver (hereinafter "SFP transceiver") to enable ruggedized installation in an avionics system. As used here, the term "ruggedize" means to strengthen a device for better resistance to the effects of vibration or humidity. More specifically, the disclosed subject matter is directed to a method for ruggedizing that converts the SFP transceiver into a dual-in-line package. Such conversion enables the SFP transceiver to be soldered directly on a printed circuit board (PCB) of a line replaceable unit (LRU) of an avionics system, thereby eliminating the concern that the SFP transceiver may become detached due to vibration during aircraft operation. The method also includes a sealing process to protect the contact pads on the SFP transceiver, thereby eliminating any concern that the contact pads could corrode due to long-term moisture and humidity exposure. The method of modification proposed herein converts a pluggable transceiver package to a dual-in-line transceiver package. The product of the method is a ruggedized installation of a SFP transceiver capable of withstanding the rigors of operating in a harsh avionics environment.

In accordance with some embodiments, the pluggable transceiver package is converted to a dual-in-line transceiver package by soldering a pin header to the contact pads on the PCB of an SFP transceiver and forming a hole in the base of the SFP transceiver for the attached pins to pass through. In one proposed implementation, an SFP transceiver having 20 contact pads is converted to a 20-pin dual-in-line package, which conversion enables the SFP transceiver to be soldered directly on the PCB (e.g., an interface PCB) of an LRU of the avionics system. The method proposed herein also includes a process for sealing the contact pads of the SFP transceiver. In addition, a pair of alignment pins are provided on the SFP package for mechanical support to aid in withstanding the high-vibration avionics environment. A further enhancement is placement of a metal cover on top of the SFP package to protect the SFP transceiver against electromagnetic interference (EMI).

As used herein, the term "dual-in-line" means that two sets of spaced-apart elements (e.g., metal pins) are arranged along respective lines. Typically the two lines are straight and mutually parallel, although straightness and parallelism are not a requirement provided that the metal pins properly align with contact pads on the LRU PCB.

The benefits of the methodology proposed herein are manifold: (1) the cost of the rugged SFP transceivers that are needed in advanced avionics fiber optic systems is reduced; (2) the use of expensive hermetic packages for the SFP transceivers is eliminated by sealing the metal contact pads of the SFP transceiver's PCB; (3) the reliability of SFP transceivers used in advanced avionics platforms is enhanced; and (4) EMI protection of the SFP transceivers used in avionics systems is provided.

Although various embodiments of a method for modifying an SFP transceiver to increase resistance to adverse environmental effects (such as vibration and humidity) will be described in some detail below, one or more of those embodiments may be characterized by one or more of the following aspects.

One aspect of the subject matter disclosed in detail below is a method for modifying a small form factor pluggable (SFP) transceiver. The method comprises: removing a cover from the SFP transceiver; separating a printed circuit board (PCB) of the SFP transceiver from a metal base of the SFP transceiver; soldering a multiplicity of metal pins to a multiplicity of contact pads on the PCB, the metal pins being held in spaced-apart relationship by a pin holder; forming a feed-through hole in a bottom of the metal base; seating the PCB on the metal base while also seating the pin holder in the feed-through hole; placing a different cover over the PCB; and attaching the different cover to the metal base.

In accordance with one embodiment of the method described in the immediately preceding paragraph, the different cover is made of a material that provides protection to the PCB against electromagnetic interference. The method in accordance with this embodiment further comprises: depositing non-conductive moisture sealant on the contact pads after soldering; and attaching first and second metal alignment pins to the bottom of the metal base.

Another aspect of the subject matter disclosed in detail below is a modified small form factor pluggable (SFP) transceiver comprising: a metal base having a bottom with a feed-through hole; a printed circuit board supported by the metal base and having an end with a multiplicity of contact pads; a pin holder comprising a pin holder made of non-electrically conductive material and a multiplicity of metal pins held in spaced-apart relationship by the pin holder; and a cover attached to the metal base, wherein the pin holder is seated in the feed-through hole and the multiplicity of metal pins each have a first portion soldered to a respective contact pad of the multiplicity of contact pads and a second portion that passes through the feed-through hole. The cover is made of a material that provides protection to the PCB against electromagnetic interference.

In accordance with one embodiment, the modified SFP transceiver described in the immediately preceding paragraph further comprises non-conductive moisture sealant that covers the multiplicity of contact pads and first and second metal alignment pins attached to the bottom of the metal base. In one proposed implementation, the multiplicity of metal pins comprises first and second rows of metal pins, and the multiplicity of contact pads comprises first and second rows of contact pads, the first row of metal pins being soldered to the first row of contact pads, and the second row of metal pins being soldered to the second row of contact pads.

A further aspect of the subject matter disclosed in detail below is a data transmission system comprising: a fiber optical network; a modified small form factor pluggable (SFP) transceiver optically coupled to the fiber optical network and comprising a multiplicity of contact pads; and an electronic device comprising a first printed circuit board (PCB) having a multiplicity of printed through holes respectively electrically coupled to the multiplicity of contact pads of the modified SFP transceiver. The modified SFP transceiver further comprises: a metal base having a bottom with a feed-through hole; a second printed circuit board (PCB) supported by the metal base and having an end with the multiplicity of contact pads; a pin holder comprising a pin holder made of non-electrically conductive material and a multiplicity of metal pins held in spaced-apart relationship by the pin holder; and a cover attached to the metal base. The pin holder is seated in the feed-through hole and the multiplicity of metal pins each have a first portion soldered to a respective contact pad of the multiplicity of contact pads, a second portion that passes through the feed-through hole and a third portion soldered to a respective printed through hole of the multiplicity of printed through holes.

In accordance with one embodiment of the data transmission system described in the immediately preceding paragraph, the modified SFP transceiver further comprises non-conductive moisture sealant that covers the multiplicity of contact pads soldered with the multiplicity of metal pins. The modified SFP transceiver also comprises first and second metal alignment pins attached to the bottom of the metal base. The first and second metal alignment pins are soldered to the first PCB of the electronic device. In accordance with one proposed application, the electronic device is a line replaceable unit installed on an aircraft.

Other aspects of methods for modifying an SFP transceiver to increase resistance to adverse environmental effects are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

FIG. 4 is a diagram representing a sectional view of a terminus/receptacle assembly.

FIG. 5 is a diagram representing a side view of a portion of an optical fiber cable that may be inserted into the terminus depicted in FIG. 4 for the purpose of optically coupling an optical fiber to an optoelectronic device.

Reference will hereinafter be made to the drawings in which similar elements in different drawings bear the same reference numerals.

DETAILED DESCRIPTION

Illustrative embodiments of methods for modifying an SFP transceiver to increase resistance to adverse environmental effects are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Various embodiments of a fiber optical network for enabling optical communication between line replaceable units on an aircraft will be described in detail below for the purpose of illustration. However, implementation of the fiber optical networks disclosed herein is not limited solely to the environment of an aircraft, but rather may be utilized in fiber optical networks onboard other types of vehicles or other types of fiber optical networks (e.g., long-distance terrestrial, data center and fiber-to-the-home/office applications).

Fiber optical networks have the advantages of higher speed, lower weight and electromagnetic interference immunity over copper wire networks. Many models of commercial aircrafts have fiber optical networks for size, weight and power reduction. It is common practice to connect a number of line replaceable units (LRUs) to each other to achieve communication within an avionics system. For example, a number of LRUs in the forward section of a vehicle (e.g., an aircraft) have been connected to a number of LRUs in the aft section of the vehicle via an avionics data bus.

Figure 1:
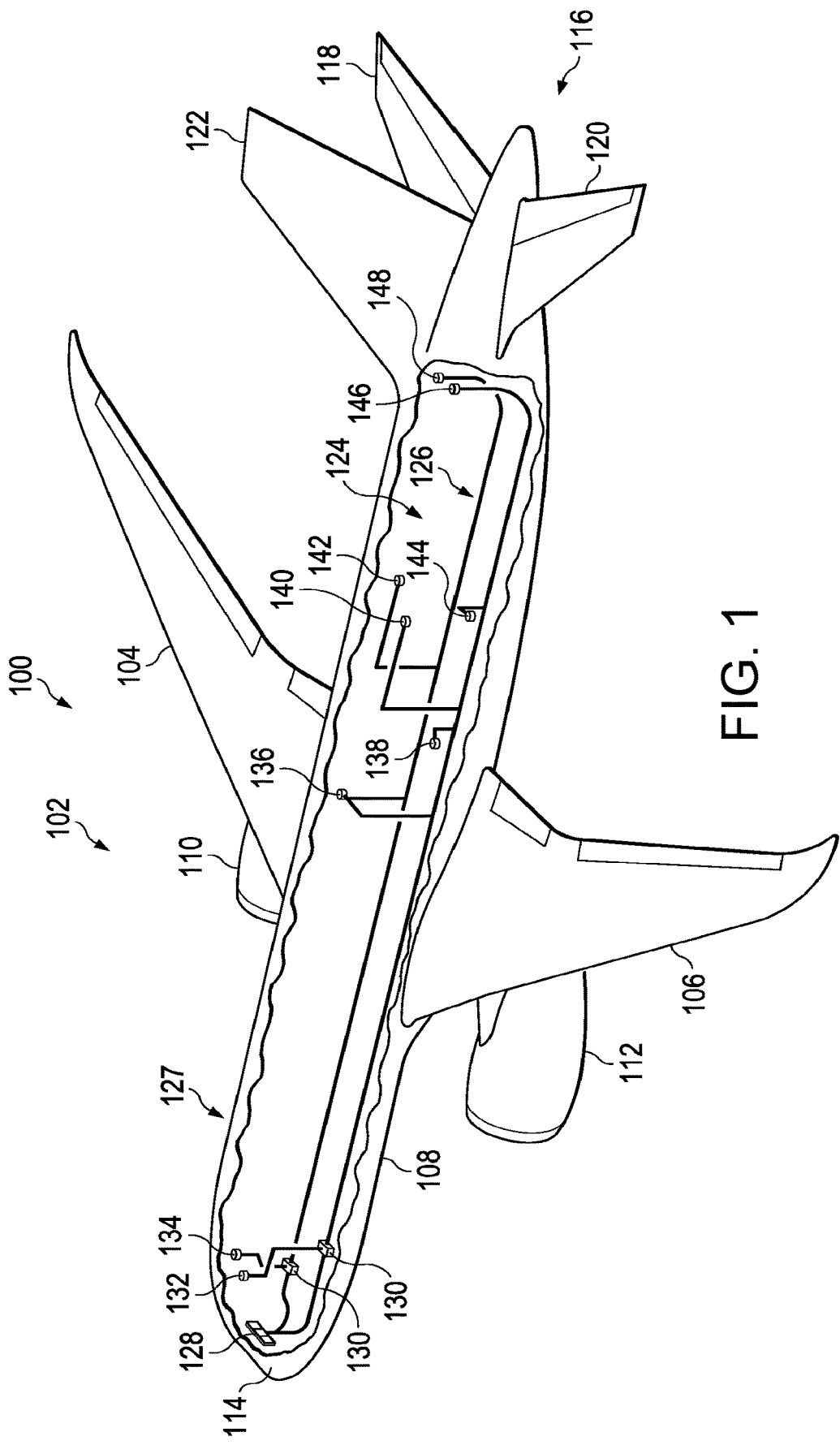
FIG. 1 is a diagram representing a three-dimensional cutaway view of a data processing system onboard an aircraft, the data processing system including an optical data communication network.

FIG. 1 illustrates a network environment 100 comprising an aircraft 102. An aircraft 102 is an example of a platform in which the connectors disclosed herein may be used. In the example depicted in FIG. 1, the aircraft 102 has right wing 104 and a left wing 106 attached to a fuselage 108. Aircraft 102 also includes an engine 110 attached to the right wing 104 and an engine 112 attached to the left wing 106. Aircraft 102 also has a nose section 114 and a tail section 116. The tail section 116 includes a right horizontal stabilizer 118, a left horizontal stabilizer 120, and a vertical stabilizer 122.

The aircraft 102 depicted in FIG. 1 further includes an onboard data communication and processing system 124 comprising a fiber optical network 126 and a plurality of devices 127, such as flight deck displays 128, flight control computers 130, and other components, which are connected (and optically coupled) to the fiber optical network 126. Other types of devices 127 may take the form of LRUs 132, 134, 136, 138, 140, 142, 144, 146 and 148. These LRUs may take various forms. For example, the LRUs may be a computer, a sensor, an in-flight entertainment system, and other suitable types of devices. The devices 127 use electrical signals internally, so the optical signals transmitted over fiber optical network 126 are typically converted into electrical signals through the use of optical-electrical media converters (not shown in FIG. 1). These optical-electrical media converters (hereinafter "optical-electrical bidirectional transceivers") may be internal or external to the LRU.

In the case of an LRU having one or more optical-electrical transceivers incorporated inside the LRU housing (hereinafter "optical-electrical LRU"), the optical-electrical LRU may be mounted to a rack onboard an aircraft by means of a mechanical assembly that provides support and self-indexing for the LRU. Each optical-electrical LRU contains an internal optical-electrical bidirectional transceiver that is optically coupled to an optical avionics data bus of the fiber optical network 126 by means of a mating connector that is mechanically coupled to the LRU housing. The mating connector provides the optical connection to aircraft systems and structural support for the LRU.

One type of high-speed (over 1 Gbits/sec) single-wavelength transceiver has one fiber for the transmit (Tx) output optical signal and another fiber for the receive (Rx) input optical signal. The transmitter has a high-speed laser diode connected to a laser driver and transmitter (Tx) integrated circuit. The receiver has a high-bandwidth detector connected to an amplifier and a receiver (Rx) integrated circuit.

Figure 2:
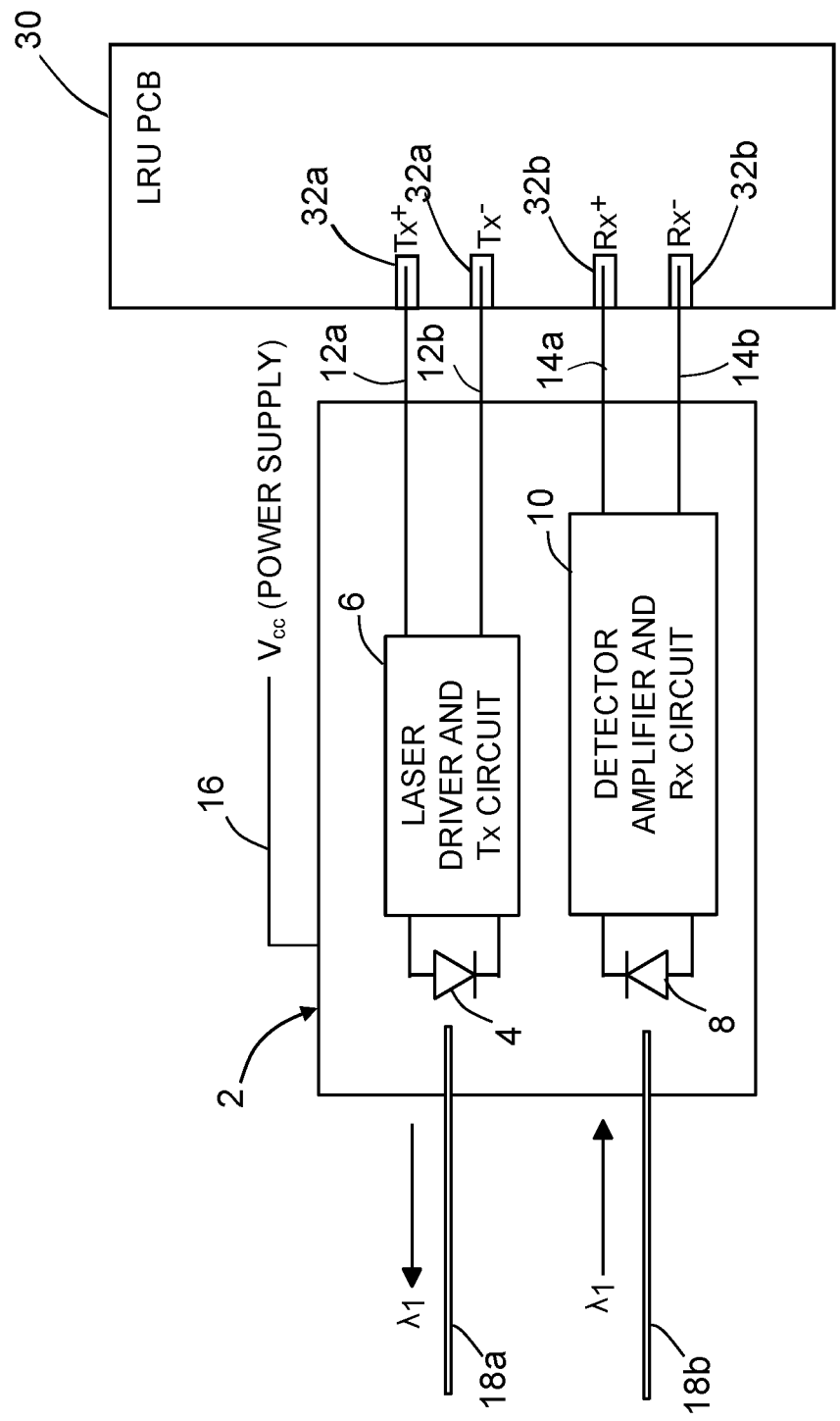
FIG. 2 is a block diagram identifying some features of a dual-fiber bidirectional SFP transceiver design in which the transceiver transmits and receives light of the same wavelength.

FIG. 2 is a diagram identifying some features of one example of an SFP transceiver 2 that has been packaged in accordance with the industrial multi-source-agreement (MSA) standard and more specifically is configured to comply with SFP specifications. In this example, the SFP transceiver 2 is a single-wavelength dual-fiber transceiver that transmits and receives light of the same wavelength $\lambda_1$. [As used herein, the term "wavelength" in the context of coherent laser light means the center wavelength of laser light having a narrow spectral width.] The SFP transceiver 2 partly depicted in FIG. 2 may be ruggedized in accordance with the methodology disclosed in detail below.

As seen in FIG. 2, the SFP transceiver 2 includes a laser device 4 and a photodetector 8. The laser device 4 can be implemented with single-mode distributed feedback (DFB) lasers, multi-mode Fabry-Perot (FP) lasers or vertical cavity surface-emitting lasers (VCSEL) for high optical output power and low modal noise. The photodetector 8 can be implemented with a high-responsivity p-type intrinsic n-type (PIN) photodiode or an avalanche photodiode to provide high receiver sensitivity. The SFP transceiver 2 further includes a laser driver and transmit circuit 6 and a detector amplifier and receive circuit 10 which are surface mounted on a double-sided PCB (not shown in FIG. 2, but see PCB 40 in FIG. 3).

The laser device 4 is driven to emit light of a wavelength A, by the laser driver and transmit circuit 6 in response to receipt of differential transmit signals Tx⁺ and Tx⁻ from an interface PCB 30 of an associated LRU (not shown in FIG. 2) via transmit electrical signal lines 12a and 12b respectively. The terminals of transmit electrical signal lines 12a and 12b are soldered to respective contact pads 32a formed on the LRU interface PCB 30. The laser driver and transmit circuit 6 includes electrical circuitry that converts those differential signals to digital signals representing the data to be transmitted by the laser device 4.

Conversely, the photodetector 8 receives light of wavelength A, and converts that detected light into electrical digital signals which are provided to the detector amplifier and receive circuit 10. The detector amplifier and receive circuit 10 in turn includes electrical circuitry that converts those electrical digital signals to electrical differential receive signals Rx+ and Rx− representing the data received. The electrical differential receive signals Rx+ and Rx− are transmitted to the LRU interface PCB 30 via receive electrical signal lines 14a and 14b respectively. The terminals of receive electrical signal lines 14a and 14b are soldered to respective contact pads 32b formed on the LRU interface PCB 30.

The laser device 4 is optically coupled to an optical fiber 18a, while the photodetector 8 is optically coupled to an optical fiber 18b. Both optical fibers 18a and 18b typically have cores made of the same material having an index of refraction selected to minimize the optical loss for any light of wavelength $\lambda_1$ being transmitted along the length of the fiber. The SFP transceiver 2 partly depicted in FIG. 2 receives electrical power having a voltage $V_{cc}$ via transceiver power supply line 16.

Figure 3:
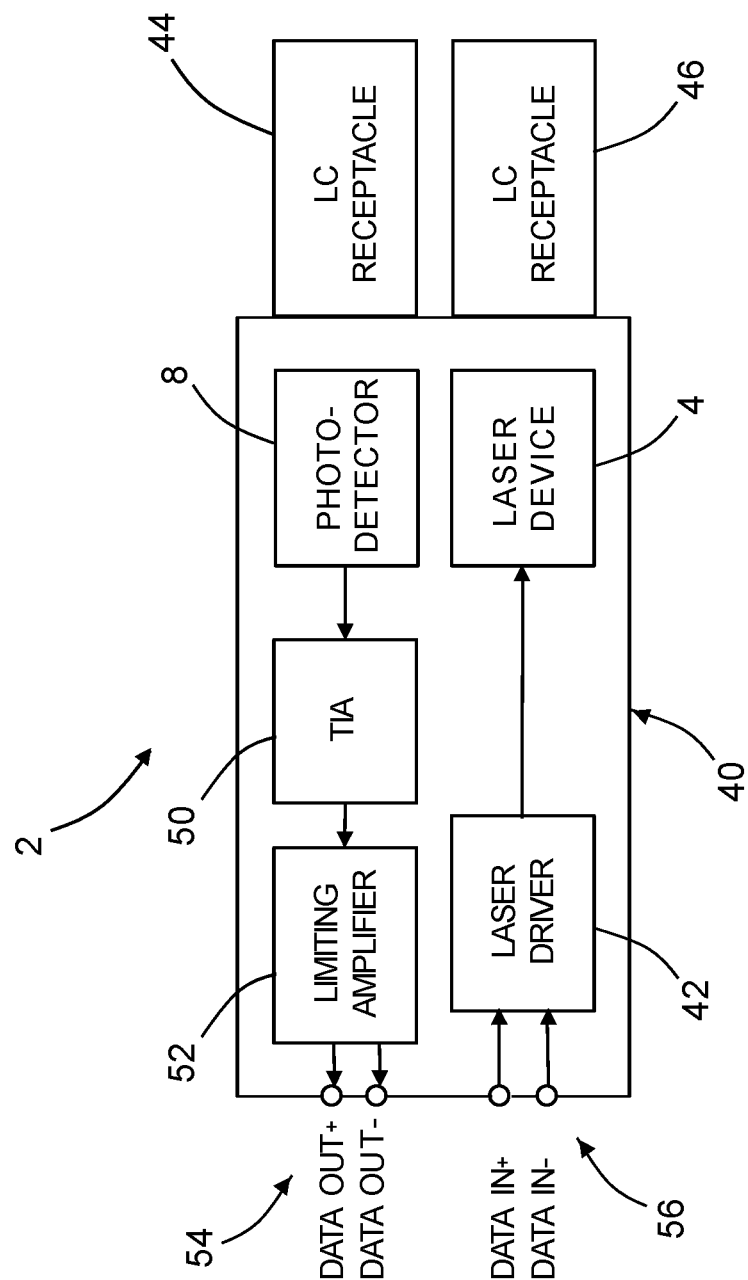
FIG. 3 is a block diagram identifying some components of a typical dual-fiber bidirectional SFP transceiver used in some legacy avionics systems.

FIG. 3 is a block diagram identifying some components of an SFP transceiver 2 that includes a bidirectional optical sub-assembly mounted to a PCB 40. The optical sub-assembly includes the laser device 4 and the photodetector 8. The laser device 4 may be implemented with a single-mode distributed feedback laser, a multi-mode Fabry-Pérot lasers or a vertical cavity surface-emitting laser for high optical output power and low modal noise. The photodetector 8 may be implemented with a high-responsivity p-type intrinsic n-type (PIN) photodiode or an avalanche photodiode to provide high receiver sensitivity.

As depicted in FIG. 3, the laser device 4 is driven to emit light by a laser driver 42 (surface mounted to PCB 40) in response to receipt at data input terminals 56 of differential transmit signals from an associated line replaceable unit (not shown) via transmit electrical signal lines (not shown in FIG. 3). The laser driver 42 includes electrical circuitry that converts those electrical differential signals to electrical digital signals representing the data to be transmitted by the laser device 4. Conversely, the photodetector 8 receives light and converts that detected light into electrical signals which are provided to a detector amplifier and receive circuit that includes a transimpedance amplifier 50 that amplifies the detector signal and a limiting amplifier 52 that performs the digitization of the output signal. The limiting amplifier 52 converts electrical signals to digital electrical differential receive signals representing the data received. The electrical differential receive signals are transmitted to the LRU interface PCB 30 via data output terminals 54 and receive electrical signal lines not shown in FIG. 3.

The SFP transceiver 2 depicted in FIG. 3 further includes a pair of LC receptacles 44 and 46 which are sized and configured to receive the termination of a respective optical fiber (not shown in FIG. 3, but see optical fiber 18 in FIG. 5). The LC receptacle 44 is positioned so that the termination of an optical fiber inserted therein confronts and is aligned with the laser device 4. In other words, the optical fiber inside LC receptacle 44 is optically coupled to receive laser pulses from the laser device 4. Similarly, the LC receptacle 46 is positioned so that the termination of an optical fiber inserted therein confronts and is aligned with the photodetector 8. In other words, the optical fiber inside LC receptacle 44 is optically coupled to emit laser pulses that will impinge on the surface of the photodetector 8 that converts photons into electrons.

In addition to the laser device 4 and photodetector, the optical sub-assembly includes two housings (hereinafter "OSA housings"). Each OSA housing consists of two integrally formed receptacles, including an LC receptacle that receives a terminated optical fiber and a second receptacle that contains the optical component to be optically coupled to the terminated optical fiber.

As seen in the example depicted in FIG. 4, a transmit OSA housing 70 includes the LC receptacle 46 with a first circular cylindrical passageway 96 sized to receive a first end section 92 of a terminus 28 and a transmitter receptacle 74 with a second circular cylindrical passageway 98 (having a diameter greater than the diameter of the first circular cylindrical passageway 96). The transmitter receptacle 74 is sized to receive a transistor outline (TO) can 72 that houses the laser device 4. The LC receptacle 46 and the transmitter receptacle 74 may be integrally formed or rigidly affixed to each other. Similarly, a detector OSA housing (not shown in FIG. 4) includes the LC receptacle 44 integrally formed with a detector receptacle that receives a TO can that houses the photodetector 8.

Still referring to FIG. 4, the terminus 28 further comprises a main body 90 and a second end section 94. The second end section 94 of the terminus 28 has a circular cylindrical cable passageway 76 that receives a jacketed portion of the optical fiber cable 20 depicted in FIG. 5. The main body 90 and first end section 92 of the terminus 28 have a common circular cylindrical fiber passageway 78 that receives an unjacketed portion of the optical fiber 18 of the optical fiber cable 20. Thus, if the portions of the optical fiber cable 20 shown in FIG. 5 were inserted into the terminus 28 shown in cross section in FIG. 4, the end face of the optical fiber 18 would be aligned with and confronting a lens installed in a window (not shown in FIG. 4) formed in the TO can 72. This physical arrangement optically couples the laser device 4 (see FIG. 3) to the optical fiber 18 (see FIG. 5). The OSA housing 70 is made of metallic material (e.g., stainless steel). Terminus 28 may be made of semi-rigid thermoplastic material or metallic material (e.g., stainless steel). One commercially available optical fiber cable 20 includes an optical fiber 18 comprising a polymer core and fluorinated polymer cladding and a jacket 86 made of polyethylene. The optical coupling between the photodetector 8 and the associated optical fiber is enabled by an OSA housing and a terminus similar to the sub-assembly depicted in FIG. 4.

Figure 6:
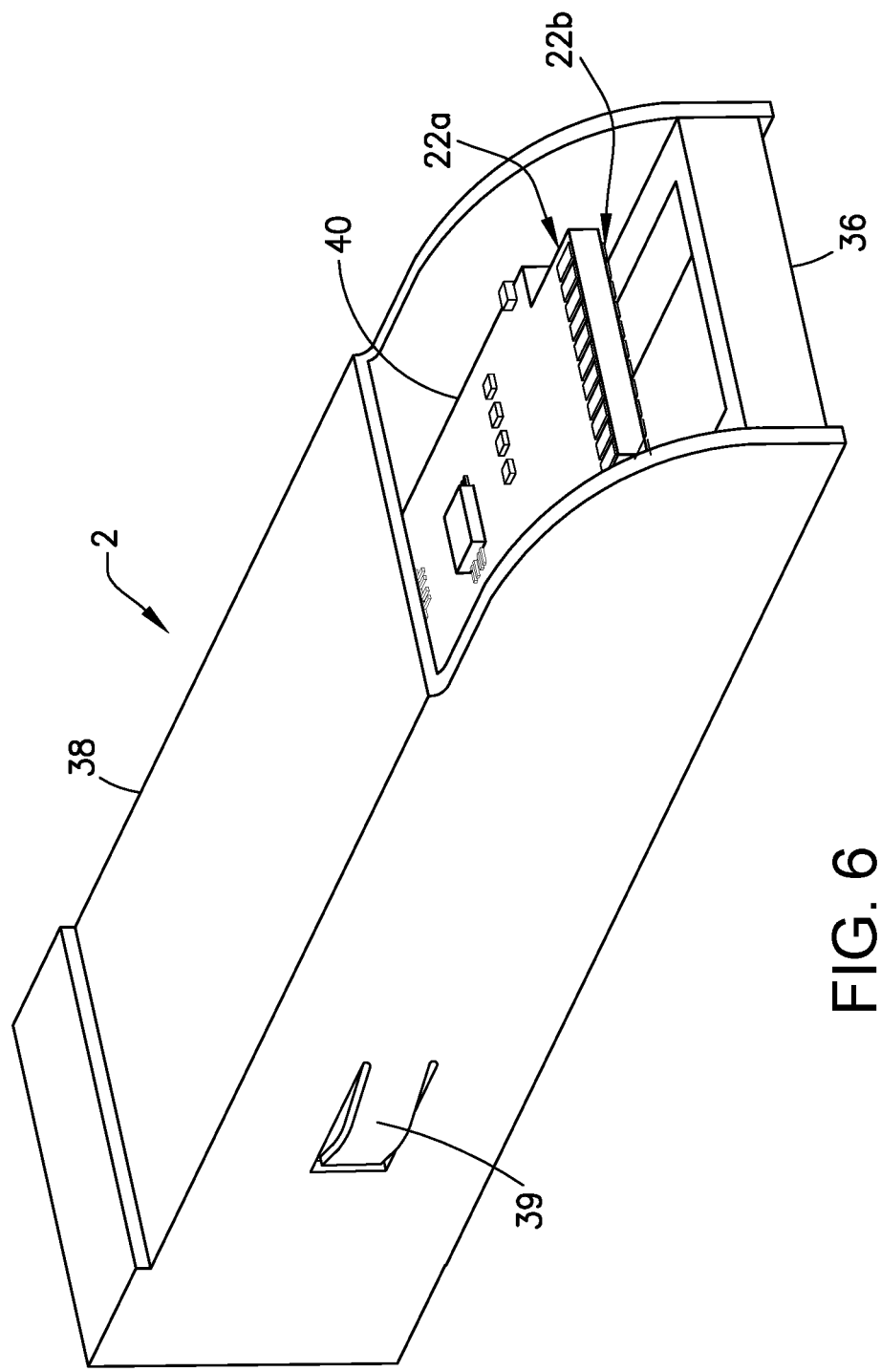
FIG. 6 is a diagram representing a three-dimensional view of an SFP transceiver that has not been modified in accordance with the method disclosed herein.

FIG. 6 is a diagram representing a three-dimensional view of an SFP transceiver 2 that has not been ruggedized. The SFP transceiver 2 includes a metal base 36, a PCB 40, various optical and electrical components mounted to the surface of PCB 40 (such as the components identified in FIG. 3), and a cover 38. The SFP transceiver 2 has two rows 22a and 22b of electrical contact pads 24 on the PCB 40 for making electrical contacts. Each of rows 22a and 22b includes ten contact pads 24. The two rows 22a and 22b of contact pads 24 are located at the back end of the PCB 40. The row 22a of contact pads 24 is disposed on a top surface of PCB 40; the row 22b of contact pads 24 is disposed on a bottom surface of PCB 40. When the SFP transceiver 2 is plugged into a socket mounted on the PCB of some other device (such as a media converter), electrical contacts are made, thereby communicatively coupling the other device to the SFP transceiver 2. This pluggable feature is good for non-avionic system applications where high vibration and high humidity are not concerns.

In accordance with the ruggedization process disclosed herein, the non-ruggedized SFP package having 20 contact pads is converted to a 20-pin dual-in-line transceiver package with a pair of alignment pins on the bottom of the package. These added features enable the SFP transceiver 2 to be soldered onto an avionics PCB permanently. Additional steps for sealing the SFP transceiver's contact pads, mounting an EMI protection cover on top and installing a pair of alignment metal pins at the bottom of the SFP package are implemented for ruggedizing the SFP transceivers attachment to the LRU's PCB. These processes enable low-cost SFP transceivers to be used in harsh avionics environments.

FIGS. 7-13 are diagrams representing respective three-dimensional views of an SFP transceiver or components thereof at respective stages of a ruggedization process in accordance with one embodiment.

(1) FIG. 6 shows a standard commercial-off-the-shelf (COTS) SFP transceiver 2 before it is disassembled.

(2) To disassemble the non-ruggedized SFP transceiver 2, two clips 39 (only one of which is visible in FIG. 6) on the sides of the transceiver's cover 38 are released and the cover 38 is removed (i.e., separated from the metal base 36).

(3) Following removal of the cover 38, the PCB 40 of SFP transceiver 2 is separated from the metal base 36. At the back end of the PCB 40 are two rows 22a and 22b of electrical contact pads 24, as previously described. The thickness of the PCB 40 is typically around 0.04 inch (40 mils). The size of each contact pad 24 is about 0.6 mm by 3.8 mm.

Figure 7:
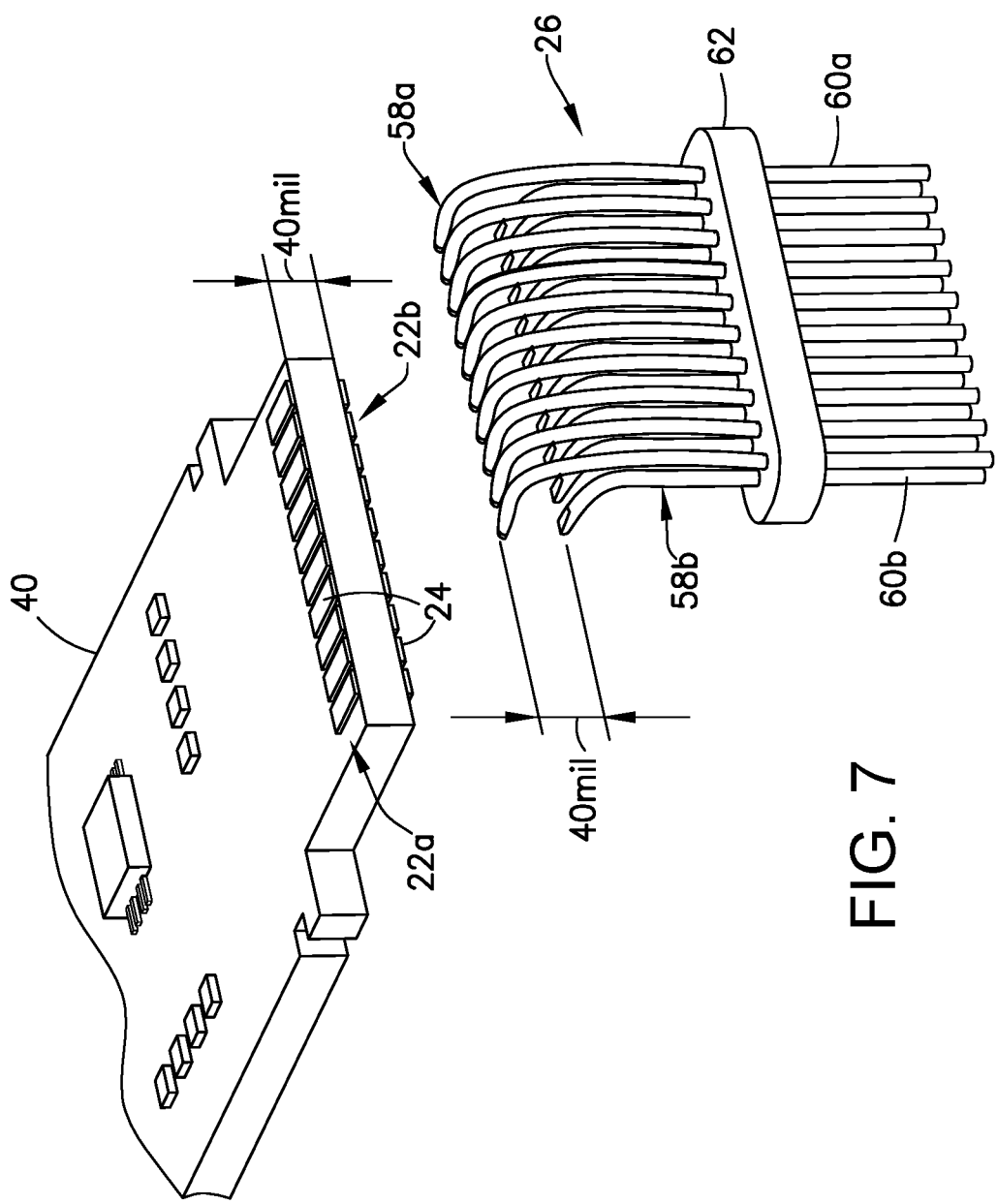
FIGS. 7-13 are diagrams representing respective three-dimensional views of an SFP transceiver or components thereof at respective stages of a modification process in accordance with one embodiment.

(4) FIG. 7 is a diagram showing a three-dimensional view of a pin header 26 placed near the contact pads 24 of the PCB 40. The pin header 26 includes a first row 58a of ten 90-degree metal pins 60a (hereinafter "metal pins 60a") and a second row 58b of ten 90-degree metal pins 60b (hereinafter "metal pins 60b"). The pin header 26 further includes a pin holder 62 made of non-conductive material (e.g., plastic). The pin header 62 has two rows of holes, with ten holes in each row, which receive and hold the vertically disposed portions of metal pins 60a and 60b in a two-row configuration. The vertically disposed portions of metal pins 60a of row 58a have a length greater than the length of metal pins 60b of row 58b by an amount approximately equal to the thickness of the PCB 40. As a result, the horizontally disposed portions of metal pins 60a are separated from the horizontally disposed portions of metal pins 60b by a gap which is approximately equal to the thickness of PCB 40, which in this example is 40 mils. The diameter and lateral spacing of the metal pins 60a and 60b match the width and lateral spacing of the contact pads 24 on the PCB 40. The proximal ends of metal pins 60a and 60b (the pin ends that will be attached to the contact pads 24) are generally disposed in a vertical plane, while the distal terminations of metal pins 60a and 60b (the pin ends below the pin holder 62) are generally disposed in a horizontal plane (assuming the metal base 36 is disposed horizontally in FIG. 7).

Figure 8A:
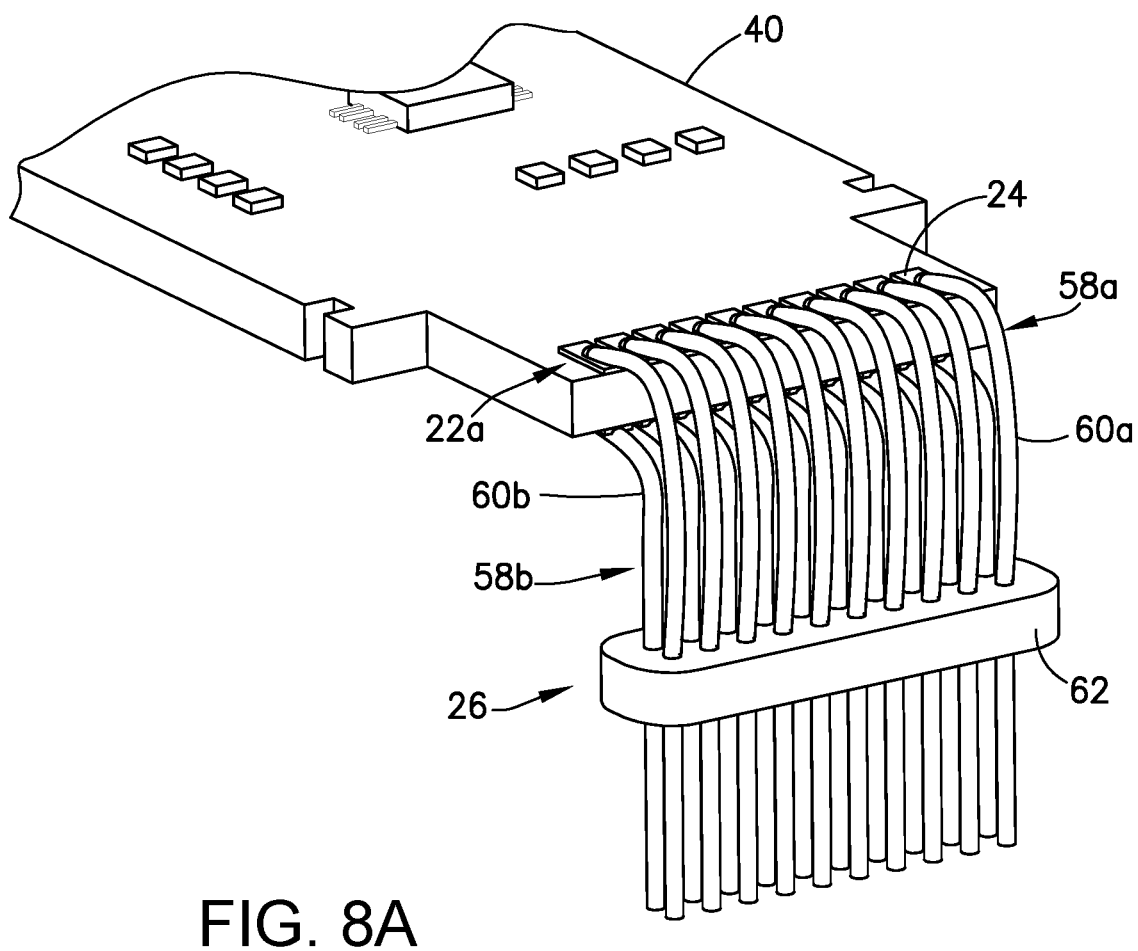
Figure 8B:
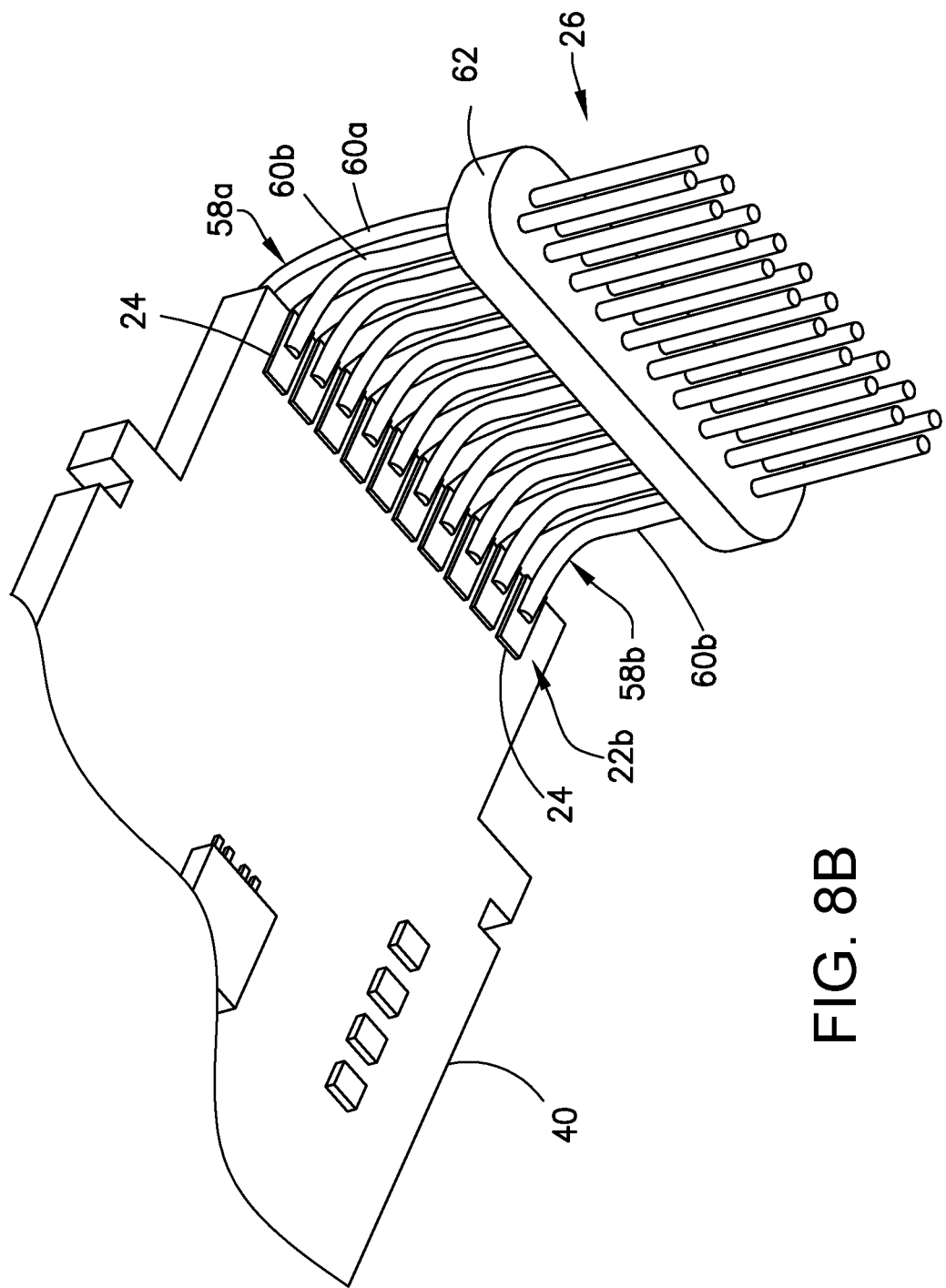

(5) The pin header 26 is moved from the location depicted in FIG. 7 to a location (shown in FIGS. 8A and 8B) where metal pins 60a of row 58a respectively contact (abut) contact pads 24 of row 22a and metal pins 60b of row 58a respectively contact (abut) contact pads 24 of row 22b. This is accomplished by sliding the horizontally disposed portions of the metal pins 60a and 60b onto the back end of the PCB 40. Then the metal pins 60a of row 58a are respectively soldered to contact pads 24 of row 22a and metal pins 60b of row 58b are respectively soldered to contact pads 24 of row 22b. FIGS. 8A and 8B are diagrams showing respective three-dimensional views of the pin header 26 after the metal pins 60a and 60b have been soldered to the contact pads 24 of the PCB 40. In accordance with one proposed implementation, the metal pins are soldered using an avionics-grade solder alloy (not shown in FIGS. 8A and 8B), such as a gold-tin (AuSn) alloy or a tin-silver (AgSn) alloy which have excellent durability for temperature cycling and vibration.

Figure 9:
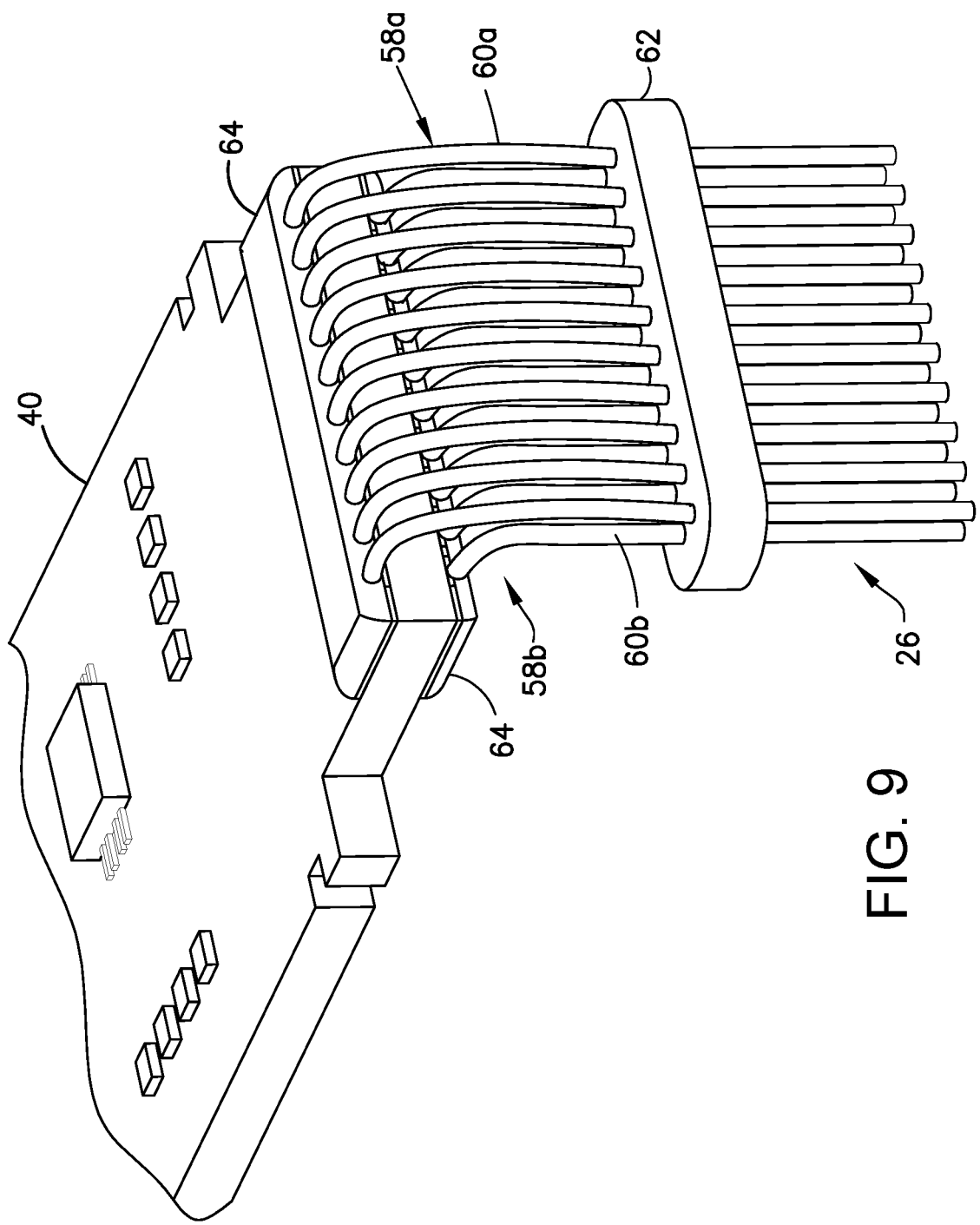

(6) After soldering the pin header 26 to the PCB 40, the next step in the transceiver modification process is to deposit a layer of non-conductive moisture sealant 64 on the top and bottom surfaces of the contact pads 24 and abutting portions of metal pins 60a and 60b. FIG. 9 is a diagram showing a three-dimensional view of the pin header/PCB assembly after the deposition of non-conductive moisture sealant 64. The non-conductive moisture sealant 64 protect the metal contact pads 24 and solder from corrosion in an avionics environment. This sealant can be an epoxy glob top material used in a standard PCB chip-on-board electronic packaging process, such as the process disclosed by Chan et al. in "High performance, low-cost chip-on-board (COB) FDDI transmitter and receiver for avionics applications," IEEE 1998 Proceedings, 48$^{th}$ Electronic Components and Technology Conference, Seattle, Wash., USA, May 25-28, 1998, p. 410.

Figure 10:
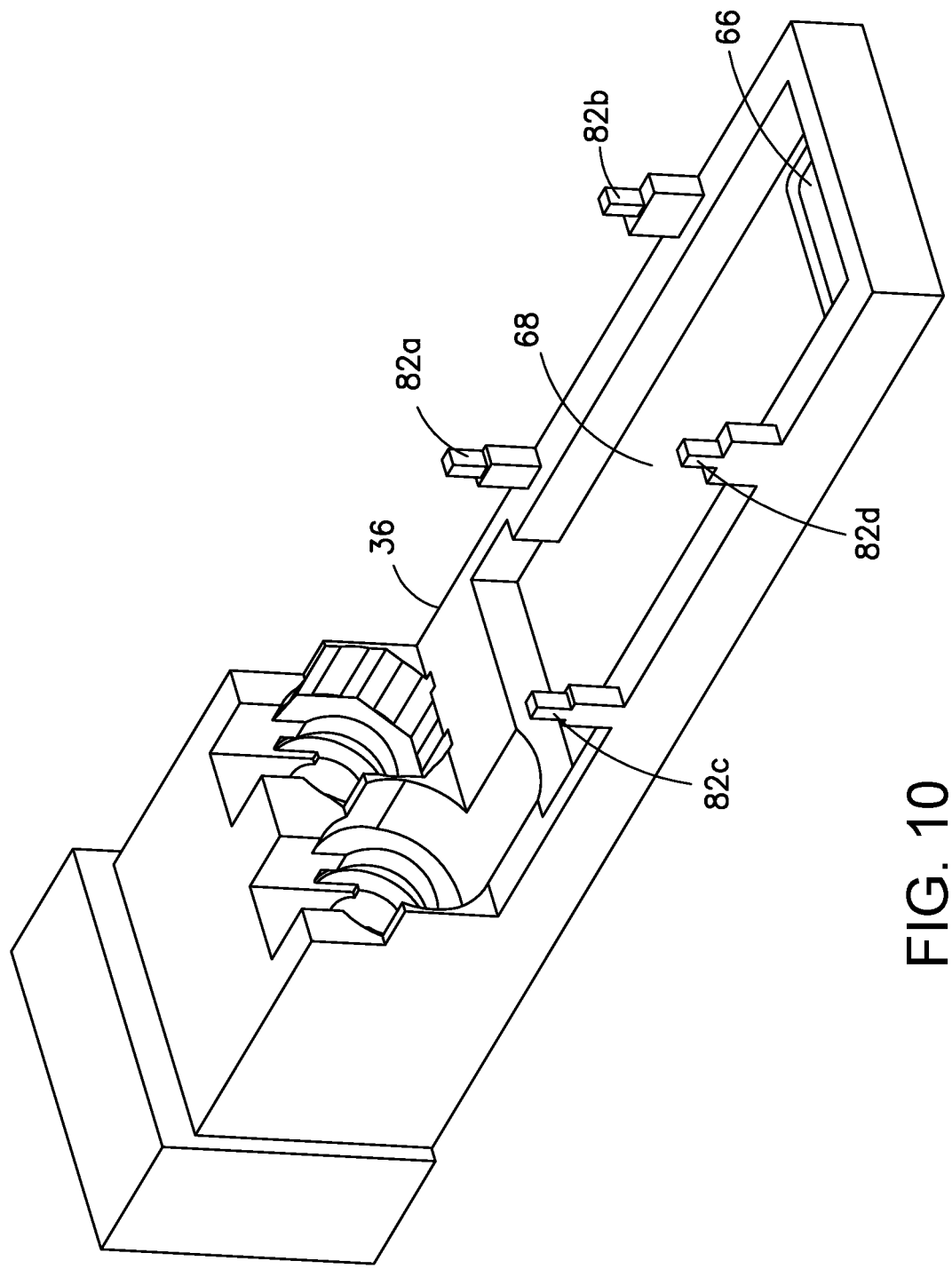

(7) In addition to the above-described modification of the PCB 40 of the SFP transceiver 2, the metal base 36 of the SFP transceiver 2 is modified by forming an opening for passage of the vertically disposed portions of the metal pins 60a and 60b. FIG. 10 is a diagram showing a three-dimensional view of the metal base 36 after the formation of a feed-through hole 66 in the bottom 68 of the metal base 36. The size and shape of the feed-through hole 66 are designed to match the size and shape of the pin holder 62. The pin holder 62 is seated in the feed-through hole 66 when the modified PCB 40 and modified metal base 36 are reassembled. The metal base 36 has four support posts 82a-82d which are designed to support the PCB 40 when the PCB 40 and metal base 36 are assembled. The PCB support posts 82a-82d have specially designed recess slots where the PCB 40 will be seated to enable the PCB's "plugging-in and removal" operation.

Figure 11:
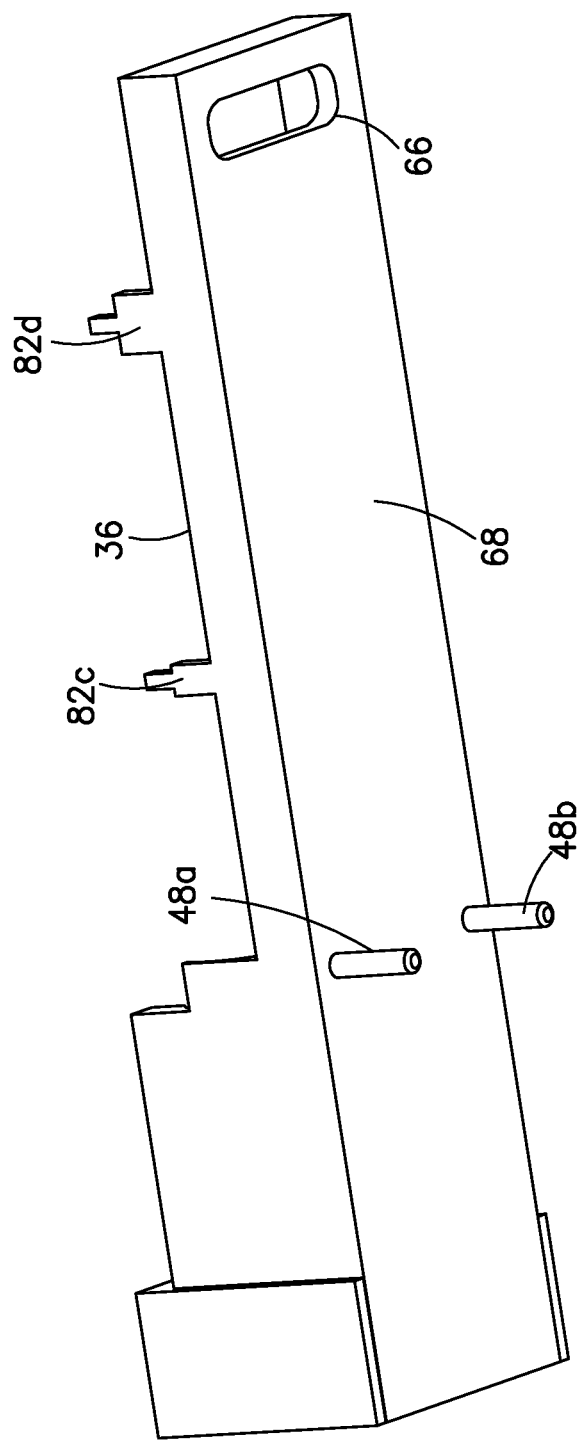

(8) After or before the feed-through hole 66 is formed, two metal alignment pins 48a and 48b are inserted in respective holes formed in the bottom 68 of the metal base 36 by press fitting (or other mechanical process). FIG. 11 is a diagram showing a three-dimensional view of the metal base 36 after the formation of feed-through hole 66 and after attachment of metal alignment pins 48a and 48b. The two metal alignment pins 48a and 48b aid the alignment of the distal terminations of the metal pins 60a and 60b onto the printed through holes (PTH) of the LRU PCB (not shown in FIG. 11, but see LRU interface PCB 30 in FIG. 15) during the soldering process. For example, the distal ends of the two metal alignment pins 48a and 48b may be inserted in respective printed through holes formed in the LRU PCB. The two metal alignment pins 48a and 48b are also soldered on two printed through holes on the LRU PCB to prevent detachment of the modified SFP transceiver from the LRU PCB in a high-vibration and shock environment.

Figure 12:
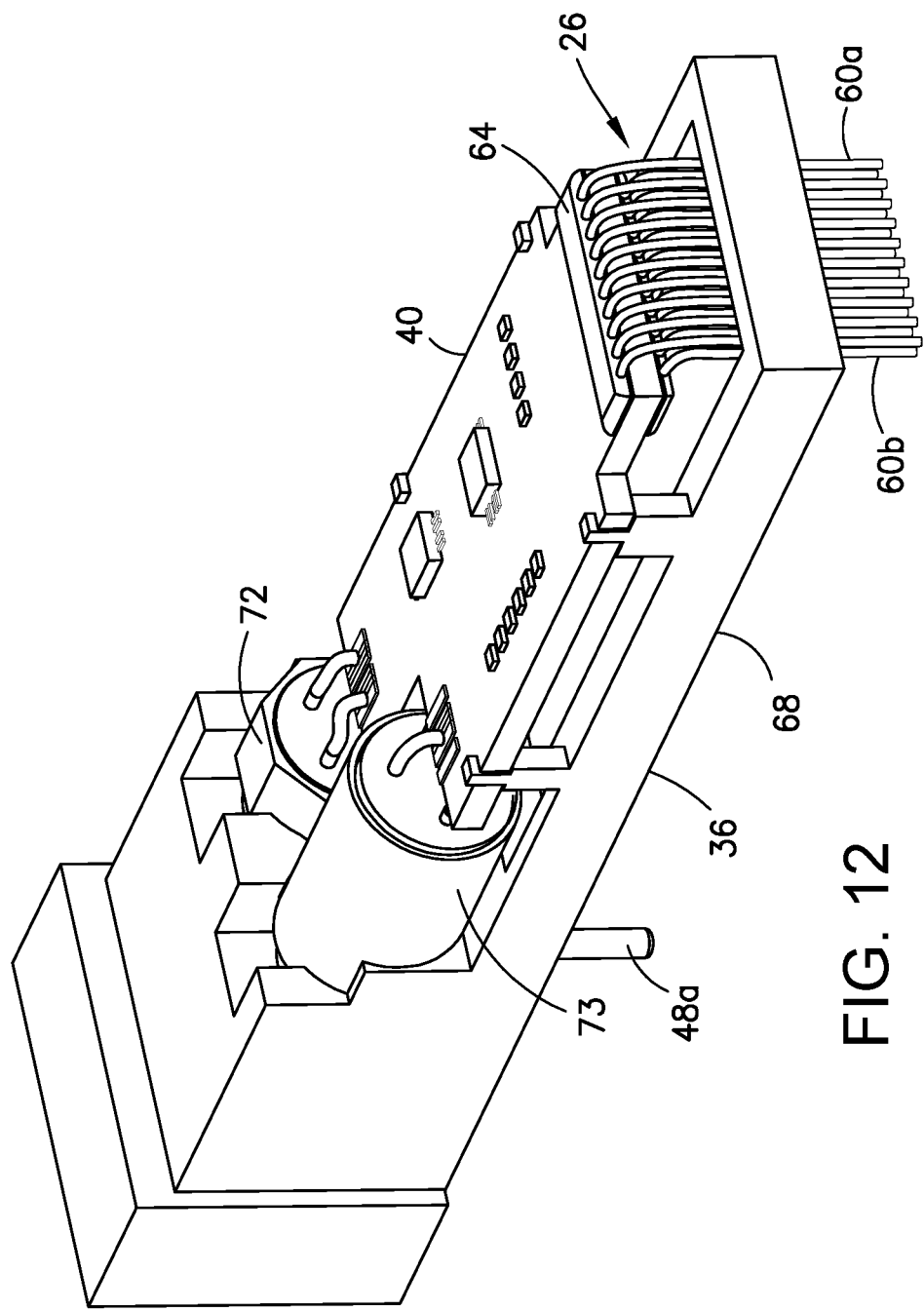

(9) After the above-described modifications to the PCB 40 and metal base 36, the PCB 40 is reattached to the metal base 36 in a well-known manner. First, the pin header 26 is fed through the feed-through hole 66 until the plastic pin holder 62 is press fit into the opening. During this movement, the PCB 40 is seated in the PCB support posts 82a-82d. Space grade non-conductive epoxy (not shown in the drawings) is used to securely mount the PCB 40 onto the support posts 82a-82d on the metal base 36. FIG. 12 is a diagram showing a three-dimensional view of the metal base 36 and PCB 40 after reassembly with the metal alignment pins 48a and 48b (two in number) and metal pins 60a and 60b (20 in number) projecting downward below the plane of the bottom 68 of the metal base 36.

Figure 13:
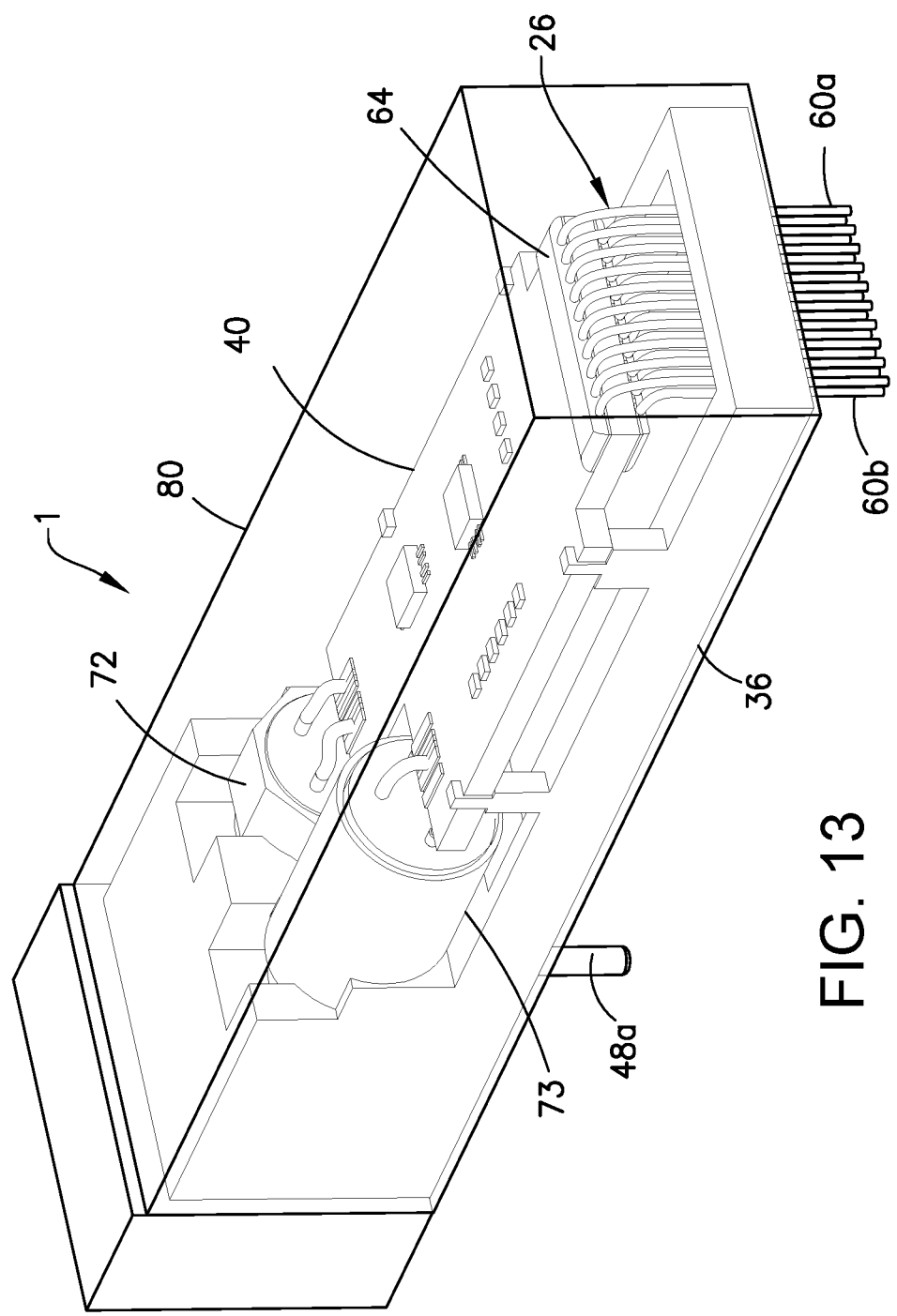

(10) After the metal base 36 and PCB 40 have been reassembled, a metal cover 80 placed over PCB 40 and attached to metal base 36, as shown in FIG. 13. The metal cover 80 is held on top of the package by means of retaining clips and non-conductive space grade epoxy on the side of metal base 36 (not shown in FIG. 13). The result of the above-described modification process is a ruggedized SFP transceiver 1 having dual-in-line metal pins which enable the ruggedized SFP transceiver 1 to be permanently soldered on the PCB of the LRU in an avionics system. The metal cover 80 provides EMI shielding of the SFP transceiver's PCB 40.

Figure 14:
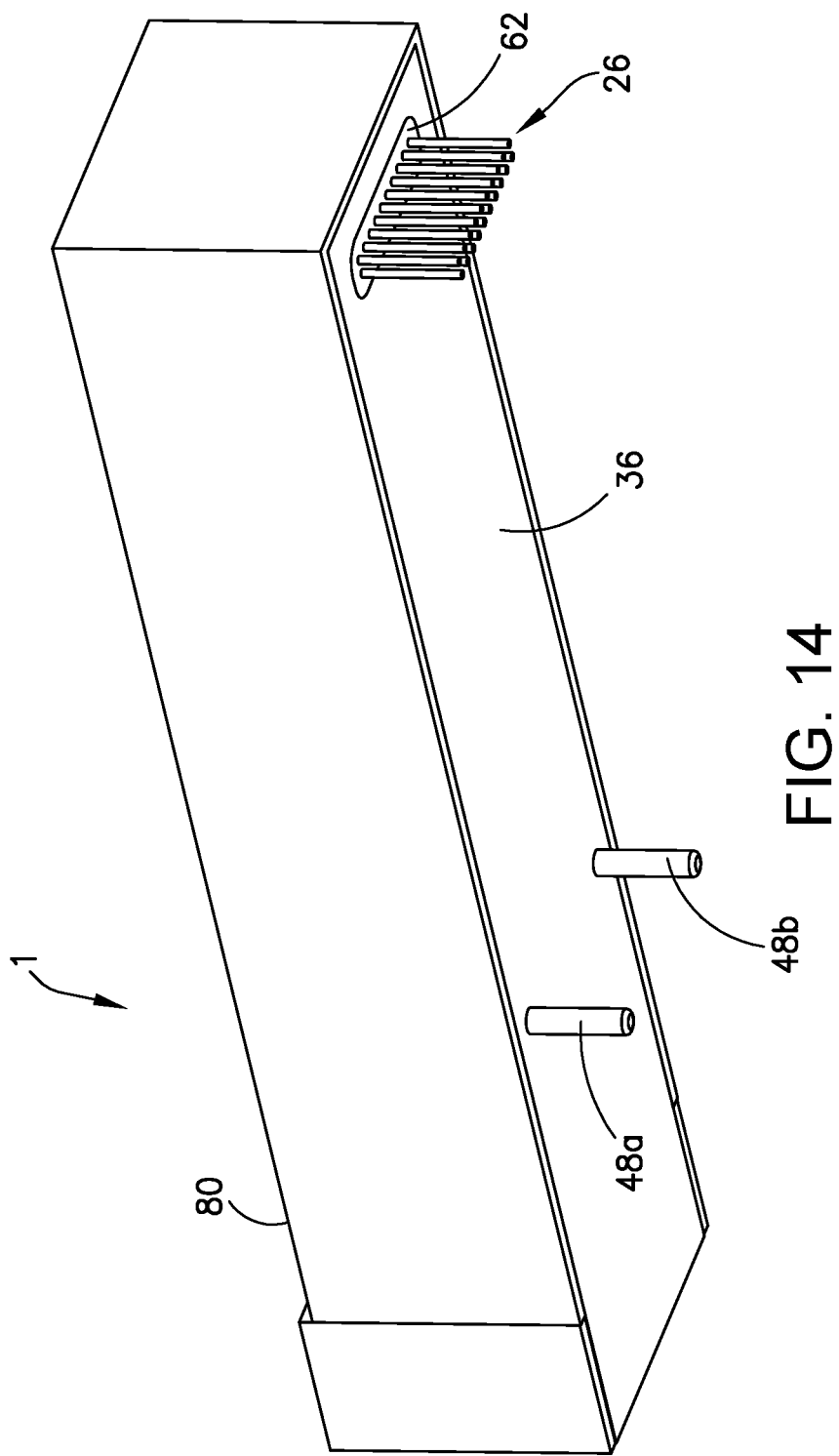
FIG. 14 is a diagram representing a three-dimensional view of a ruggedized SFP transceiver in accordance with one embodiment.

FIG. 14 is a diagram showing a three-dimensional view of the ruggedized SFP transceiver 1 after completion of the modification process in accordance with one embodiment. The reassembled ruggedized SFP transceiver 1 is ready for permanent soldering on a PCB of an avionics LRU, with moisture seal protection (non-conductive moisture sealant 64), metal alignment pins 48a and 48b for vibration protection and a metal cover 80 for EMI protection.

Figure 15:
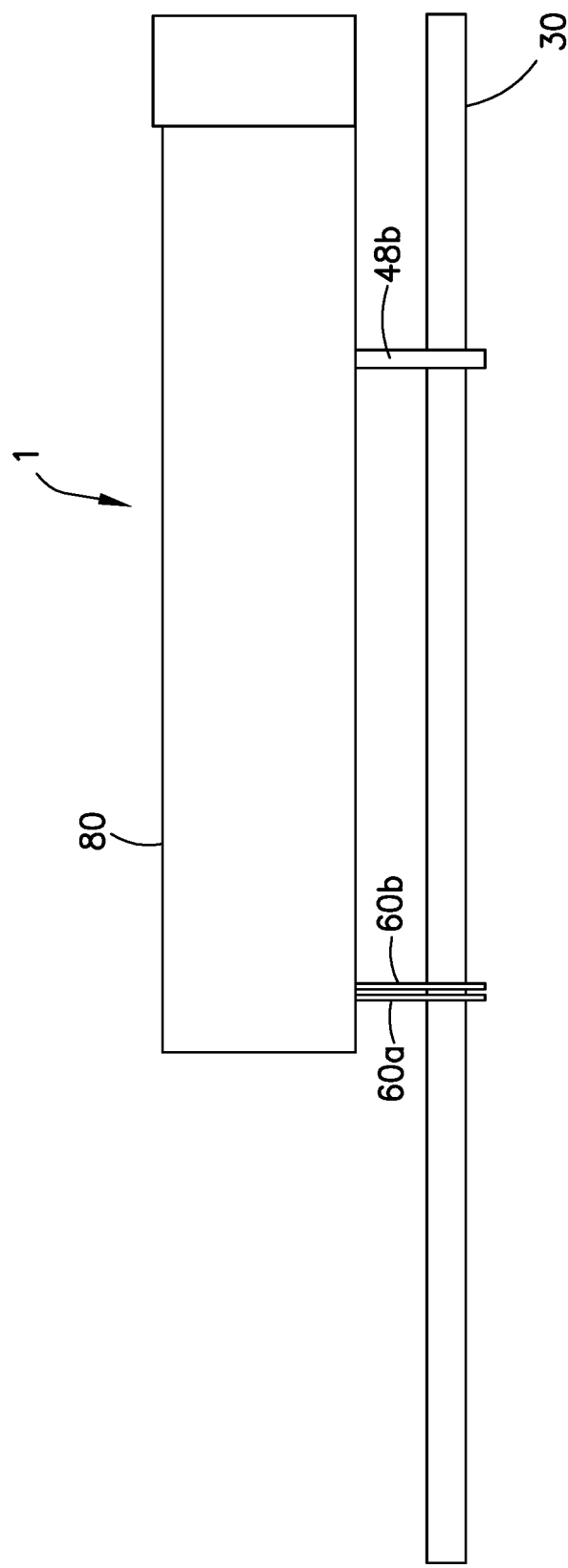
FIG. 15 is a diagram representing a side view of a ruggedized SFP transceiver soldered to an LRU PCB in accordance with one embodiment.

FIG. 15 is a diagram representing a side view of a ruggedized SFP transceiver 1 soldered to an LRU interface PCB 30 in accordance with one embodiment. The distal ends of the two metal alignment pins 48a and 48b and the twenty metal pins 60a and 60b are soldered to the metal LRU interface PCB 30 (the solder is not shown in FIG. 15). These two metal alignment pins 48a and 40b provide the SFP package alignment for the electrical metal pins 60a and 60b to the printed through holes on the LRU interface PCB 30 and also provide high retention of the SFP package to the LRU interface PCB 30. Therefore, the overall mechanical design of the SFP package has better endurance to high vibration and high humidity.

In summary, the SFP transceiver modification process proposed herein converts the SFP transceiver from a pluggable package to a dual-in-line package which can be reliably soldered onto the PCB of an avionics LRU, with moisture protection seal on the electrical contacts, an EMI protection top cover, and two alignment pins providing mechanical protection for high vibration and extreme temperature cycling. The conversion process is very low cost and meets the stringent performance and environmental requirements of avionics systems.

While methods for modifying an SFP transceiver to increase resistance to adverse environmental effects have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the method claims be construed to exclude any portions of two or more steps being performed concurrently or alternatingly unless the claim language explicitly states a condition that precludes such an interpretation.

The invention claimed is:

1. A method for modifying a small form factor pluggable (SFP) transceiver, the method comprising:
   removing a cover from the SFP transceiver;
   separating a printed circuit board (PCB) of the SFP transceiver from a metal base of the SFP transceiver;
   soldering a multiplicity of metal pins to a multiplicity of contact pads on the PCB, the metal pins being held in spaced-apart relationship by a pin holder;
   depositing non-conductive moisture sealant on the contact pads after soldering;
   forming a feed-through hole in a bottom of the metal base;
   seating the PCB on the metal base while also seating the pin holder in the feed-through hole;
   placing a different cover over the PCB; and
   attaching the different cover to the metal base.

2. The method as recited in claim 1, wherein the different cover is made of a material that provides protection to the PCB against electromagnetic interference.

3. The method as recited in claim 1, wherein the multiplicity of metal pins comprises first and second rows of metal pins, and the multiplicity of contact pads comprises first and second rows of contact pads, the first row of metal pins being soldered to the first row of contact pads, and the second row of metal pins being soldered to the second row of contact pads.

4. The method as recited in claim 3, wherein the first row of contact pads is disposed on a top surface of the PCB and the second row of contact pads is disposed on a bottom surface of the PCB.

5. The method as recited in claim 3, wherein distal terminations of the multiplicity of metal pins are coplanar.

6. The method as recited in claim 5, further comprising soldering the distal terminations of the multiplicity of metal pins to a PCB of a line replaceable unit onboard an aircraft.

7. The method as recited in claim 3, further comprising attaching first and second metal alignment pins to the bottom of the metal base.

8. The method as recited in claim 7, further comprising soldering distal terminations of the multiplicity of metal pins and distal ends of the first and second metal alignment pins to a PCB of a line replaceable unit onboard an aircraft.

9. A method for modifying a small form factor pluggable (SFP) transceiver, the method comprising:
   removing a cover from the SFP transceiver;
   separating a printed circuit board (PCB) of the SFP transceiver from a metal base of the SFP transceiver;
   soldering a multiplicity of metal pins to a multiplicity of contact pads on the PCB, the metal pins being held in spaced-apart relationship by a pin holder;
   forming a feed-through hole in a bottom of the metal base;
   seating the PCB on the metal base while also seating the pin holder in the feed-through hole;
   placing a different cover over the PCB; and
   attaching the different cover to the metal base,
   wherein the multiplicity of metal pins comprises first and second rows of metal pins, and the multiplicity of contact pads comprises first and second rows of contact pads, the first row of metal pins being soldered to the first row of contact pads, and the second row of metal pins being soldered to the second row of contact pads.

10. The method as recited in claim 9, wherein the first row of contact pads is disposed on a top surface of the PCB and the second row of contact pads is disposed on a bottom surface of the PCB.

11. The method as recited in claim 9, wherein distal terminations of the multiplicity of metal pins are coplanar.

12. The method as recited in claim 11, further comprising soldering the distal terminations of the multiplicity of metal pins to a PCB of a line replaceable unit onboard an aircraft.

13. The method as recited in claim 9, further comprising attaching first and second metal alignment pins to the bottom of the metal base.

14. The method as recited in claim 13, further comprising soldering distal terminations of the multiplicity of metal pins and distal ends of the first and second metal alignment pins to a PCB of a line replaceable unit onboard an aircraft.

15. The method as recited in claim 9, wherein the different cover is made of a material that provides protection to the PCB against electromagnetic interference.

16. A method for modifying a fully assembled small form factor pluggable (SFP) transceiver that comprises a cover, a printed circuit board (PCB), and a metal base when fully assembled, the method comprising:
(a) separating the cover from the metal base;
(b) separating the PCB from the metal base;
(c) soldering a multiplicity of metal pins to a multiplicity of contact pads on the PCB, the metal pins being held in spaced-apart relationship by a pin holder;
(d) forming a feed-through hole in a bottom of the metal base;
(e) seating the PCB on the metal base while also seating the pin holder in the feed-through hole;
(f) placing a different cover over the PCB; and
(g) attaching the different cover to the metal base,
further comprising soldering distal terminations of the multiplicity of metal pins to a PCB of a line replaceable unit onboard an aircraft.

17. The method as recited in claim 16, wherein the different cover is made of a material that provides protection to the PCB against electromagnetic interference.

18. The method as recited in claim 16, further comprising depositing non-conductive moisture sealant on the contact pads after soldering.

19. The method as recited in claim 16, wherein the multiplicity of metal pins comprises first and second rows of metal pins, and the multiplicity of contact pads comprises first and second rows of contact pads, the first row of metal pins being soldered to the first row of contact pads, and the second row of metal pins being soldered to the second row of contact pads.

20. The method as recited in claim 16, wherein the first row of contact pads is disposed on a top surface of the PCB and the second row of contact pads is disposed on a bottom surface of the PCB.

* * * * *